United States Patent [19]

Flint et al.

[11] Patent Number: 4,964,458
[45] Date of Patent: Oct. 23, 1990

[54] FLEXIBLE FINNED HEAT EXCHANGER

[75] Inventors: Ephraim B. Flint, Garrison; Kurt R. Grebe, Beacon; Peter A. Gruber, Mohegan Lake; Arthur R. Zingher, White Plains, all of N.Y.

[73] Assignee: International Business Machines Corporation

[21] Appl. No.: 161,880

[22] Filed: Feb. 29, 1988

Related U.S. Application Data

[63] Continuation-in-part of Ser. No. 858,318, Apr. 30, 1986, Pat. No. 4,730,666.

[30] Foreign Application Priority Data

Jan. 20, 1987 [JP]   Japan ............................. 62-9218
Apr. 1, 1987 [EP]   European Pat. Off. ......... 871048096

[51] Int. Cl.⁵ ............................................. F24C 1/04
[52] U.S. Cl. ..................................... 165/80.4; 165/46; 357/84
[58] Field of Search ................... 165/80.4, 46, 80 C; 357/81, 82, 84

[56] References Cited

U.S. PATENT DOCUMENTS

| | | | |
|---|---|---|---|
| 4,381,032 | 4/1983 | Cutchaw | 165/80.4 X |
| 4,686,606 | 8/1987 | Yamada et al. | 165/80.4 X |
| 4,730,666 | 3/1988 | Flint et al. | 165/80.4 X |
| 4,765,397 | 8/1988 | Chrysler et al. | 165/80.4 X |

FOREIGN PATENT DOCUMENTS

| | | |
|---|---|---|
| 2393425 | 12/1978 | France . |
| 53-45976 | 4/1978 | Japan . |
| 58-225658 | 12/1983 | Japan . |
| 59-215755 | 12/1984 | Japan . |
| 61-35526 | 2/1986 | Japan . |

OTHER PUBLICATIONS

IBM Technical Disclosure Bulletin, vol. 21, No. 5, Oct. 1978, p. 1857, New York, U.S.A., R. G. Dessauer et al. Computer Design, vol. 23, No. 14, Dec. 1984, pp. 254, 255, Littleton, Mass., U.S.A.

*Primary Examiner*—Larry Jones
*Attorney, Agent, or Firm*—Perman & Green

[57] ABSTRACT

A heat exchanger for cooling an array of electric circuit chips disposed on a common substrate is formed as a flexible sheet of thermally conducting material with understanding fins for transference of heat from the chips to a coolant flowing through the fins. Pin fins may be employed with air coolant. The sheet may be provided with corrugations set between sites of the chips for improved flexibility to accommodate individual orientations of the chips. The sheet is sufficiently large to cover an array of chips and is thermally joined, as by use of a thermally conductive grease, to the chips. The sheet hermetically seals the chips from contamination by the coolant. For liquid coolant, the heat exchanger may be fabricated of copper with a nickel coating, wherein the copper provides the heat conduction and the nickel protects the copper from a corrosive coolant such as water. In one embodiment of the heat exchanger, the fin thickness, the fin spacing and the sheet thickness are all approximately equal, a typical sheet thickness being approximately two mils. Another embodiment uses air cooling, and uses metal pin fins bonded to a metal sheet which is moderately thin and flexible. Transverse motion between the sheet and the array of chips is introduced concurrently with the application of pressure between the sheet and the chips to reduce the thickness of the layers of grease between the chips and the sheet, thereby to improve thermal conductivity between the heat exchanger and each of the chips.

3 Claims, 12 Drawing Sheets

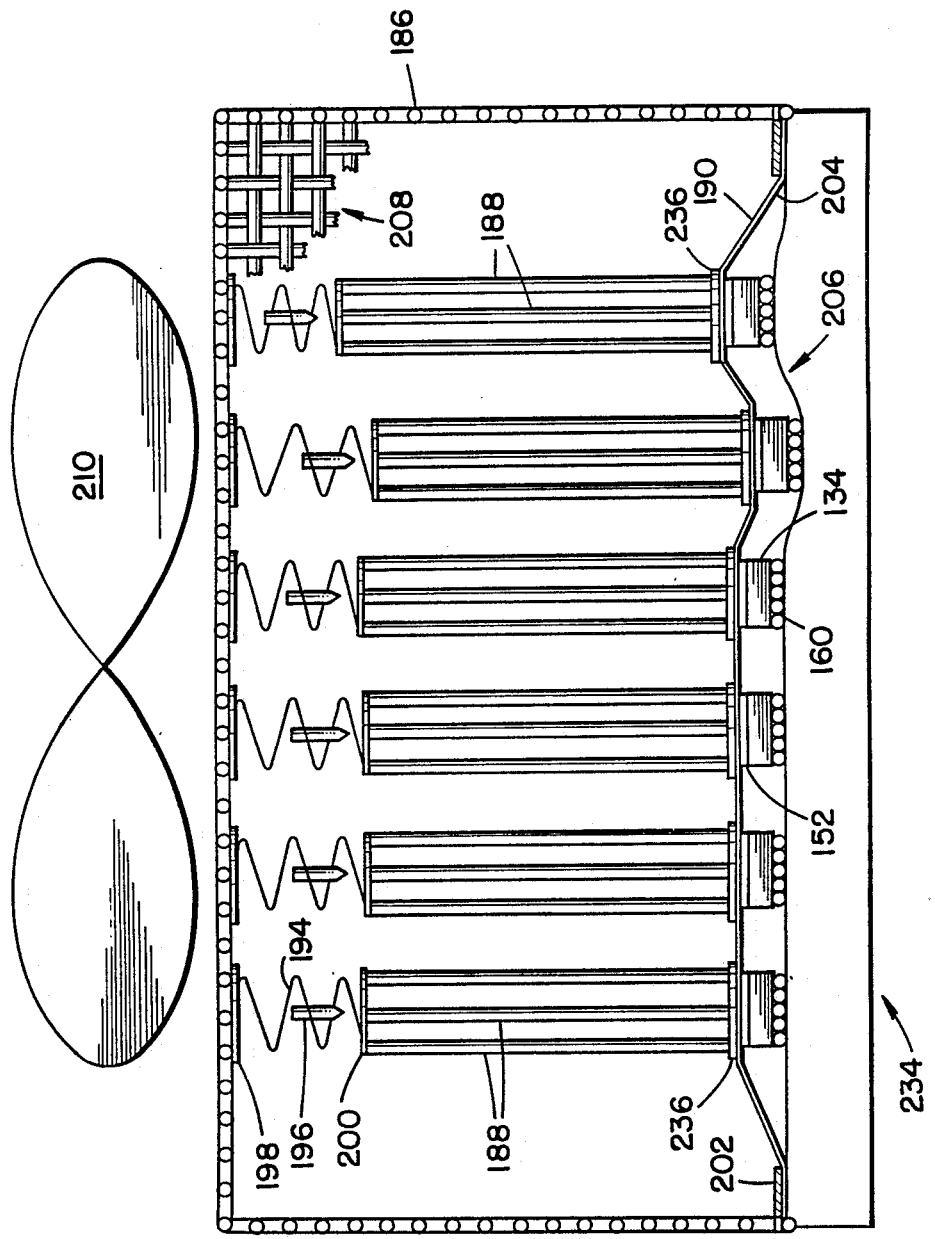

FLEXIBLE FINNED HEAT EXCHANGER

RELATED APPLICATION

This application is a continuation-in-part of original application Ser. No. 858,318 filed Apr. 30, 1986 now U.S. Pat. No. 4,730,666.

BACKGROUND OF THE INVENTION

This invention relates to a heat exchanger for transference of heat from an array of electronic circuit chips and, more particularly, to a flexible sheet having cooling fins thereon to be placed directly on the array of chips.

Arrays of electronic circuit chips are interconnected to provide vast electronic circuits. Such circuits may be employed in computers and other electronic systems utilizing very large numbers of electronic circuit components. In particular, it is noted that the many transistors and other circuit components present within a circuit chip dissipate heat in response to activation with current from an electric power supply. In order for the circuits to function properly, the heat must be removed to maintain proper operating temperature for the circuits.

One form of cooling which has been proposed is the use of a metal plate held against circuit chips by springs, as is disclosed by Cutchaw, U.S. Pat. No. 4,381,032. A heat exchanger incorporating a deflectably movable diaphragm in contiguous engagement with an integrated circuit package is disclosed by Cutchaw, U.S. Pat. No. 4,341,432 (col. 7). Another form of heat exchanger for cooling electronic circuits provides for passages within which liquid coolant is circulated, the coolant contacting a flexible wall which presses against the circuitry to be cooled as shown in Wilson et al, U.S. Pat. No. 4,072,188. Another form of heat exchanger employs coated metallic dendrites which are held by springs against a circuit chip as disclosed in Babuka et al, U.S. Pat. No. 4,254,431. Yet another form of heat exchanger employs a pillow structure formed of film and filled with a thermal liquid material for extracting heat from an electric circuit, as is disclosed in Spaight, U.S. Pat. No. 4,092,697. Also a malleable dimpled wafer is deformed by pressure between a heat source such as an electronic circuit and a heat sink, as is disclosed in Rhoades et al, U.S. Pat. No. 4,151,547. A theoretical discussion of cooling considerations is presented in an article in the IEEE Electron Devices Letters, "High Performance Heat Sinking For VLSI" by D. B. Tuckerman and R. F. W. Pease, Vol. EDL-2, No. 5, May 1981.

A problem arises in that the foregoing heat-exchanger structures are either complex, or require complex manufacturing procedures in assembling the heat exchanger with the electric circuits to be cooled. In view of the large number of circuit chips to be employed in an electronic system, and the small size of the chips which are on the order of approximately a few millimeters square, any reduction in the complexity of the heat exchanger and in the assembly procedures can significantly reduce manufacturing costs, and may even permit the use of still higher power dissipation in the electric circuits. Presently available heat exchangers do not provide these advantages.

SUMMARY OF THE INVENTION

The aforementioned aspects and other features of the invention are attained by a construction of heat exchanger which, in accordance with the invention, is formed as a flexible sheet of thermally conductive material, and is provided with a set of fins of thermally conductive material upstanding upon the flexible sheet. The sheet is large enough to encompass an array of circuit chips disposed on a common substrate and can completely blanket the array of chips. The sheet can be attached to the substrate, by use of suitable adhesives, so as to hermetically seal the chips against any contamination by a fluid coolant. In addition, the sheet may be provided with corrugations at locations between the sites of the chips so as to provide for greater flexibility and the capacity for fully aligning each portion of the sheet with the corresponding surface of a chip.

The fins are arranged in the direction of coolant flow, thereby to transfer more effectively the heat of the chip to the coolant. In one embodiment of the invention, the fins are arranged in a staggered array to promote the flow of coolant and contact between the coolant and the fins. In a further embodiment of the invention, the thickness of the fins is approximately equal to the spacing between fins which, in turn, is approximately equal to the thickness of the sheet, typically two mils.

The material used in the construction of the heat exchanger is dependent on the nature of the coolant. For example, in the case of air used as the fluid coolant, the sheet and fins of the heat exchanger may be constructed of copper which provides for good thermal conductivity and, in addition, is flexible at sheet thicknesses in the range of 0.5-5 mils. As a further example in the use of air as a coolant, aluminum pin fins are joined to an aluminum sheet. This sheet is moderately thin (3-20 mils) so as to provide adequate material heat transfer. Also, the sheet is sufficiently flexible to conform to manufacturing tolerances. In the case of a copper sheet, there is increased thermal conductivity which allows for fabrication of a thinner and/or flexible sheet. During mechanical shock or vibration, the fins can exert inertial stresses, especially on electrical contacts. Such stresses are minimized by a low mass fin geometry, and by the low density of aluminum when used in construction of the fins. In the case of a more corrosive coolant, such as water, or damp air, resistance to corrosion by water is important, particularly for protection of the sheet. Suitable corrosion resistant metalurgies are available such as stainless steel, nickel plated copper, as well as other alloy plated or laminated metals.

Good thermal conductivity between the sheet and the underlying circuit chip is attained by use of a thermally conducting grease. In addition, if desired, a spring loaded plate may be applied against the tops of the fins to urge the heat exchanger structure against the array of chips, thereby to promote good thermal conductivity between the heat exchanger and the chips.

Important features of the invention, for the case of liquid coolant, are the establishment of fine groove forced convection cooling, a flexible hermetically sealing sheet, and a fabrication of the heat exchanger by photolithographic techniques as are employed in the production of printed circuits. In the fabrication of the fins and grooves, the thickness of the fins and the width of the grooves are both equal approximately to 50 microns, such dimensions being well suited for the transference of heat from the fins to a liquid coolant such as water. It is noted that, in the construction of circuit assemblies involving multiple chips and fin assemblies coupled thereto, there are stresses associated with the attachment of a fin assembly to a chip. In the case of air coolant, the heat exchanger is formed of metal pin fins bonded to a metal sheet which is moderately thin and flexible.

Also, the chips may be mounted to a substrate by means of fragile connections in the form of solder balls, which balls may be broken by excessive stress upon a chip. The flexible sheet, in addition to protecting the circuit chips from contaminants by hermetic sealing, also isolates the foregoing stresses between chips and contiguous mechanical structure so as to protect the connections between the chips and the substrate. The convenience of manufacture of the heat exchanger by photolithographic technology is attainable, in the case of liquid coolant, because of the small fin and groove dimensions, noted above, which dimensions are suitable for masking and chemical vapor deposition to form the cooling structure of the fins and grooves.

A further feature of the invention is the application of a thin layer (on the order of one mil) of a thermally conductive grease between the flexible sheet and the surface of a chip, the grease layer being much thinner than has been obtainable heretofore, the grease layer being applied by the application of sidewise shear movement between the sheet and each of the chips concurrently with the application of a force normal to each interface between the sheet and each chip. The grease fills interstices between the sheet and each chip for enhanced thermal conductivity, the extreme thinness of the grease layer minimizing thermal resistance between chip and sheet.

BRIEF DESCRIPTION OF THE DRAWING

The aforementioned aspects and other features of the invention are explained in the following description, taken in connection with the accompanying drawing wherein:

FIG. 21 shows diagrammatically a further embodiment of the invention similar to the embodiment of FIG. 18, but including a set of individual pedestals in registration with respective ones of the circuit chips for securely supporting fins of a heat exchanger.

DETAILED DESCRIPTION

Figure 1:
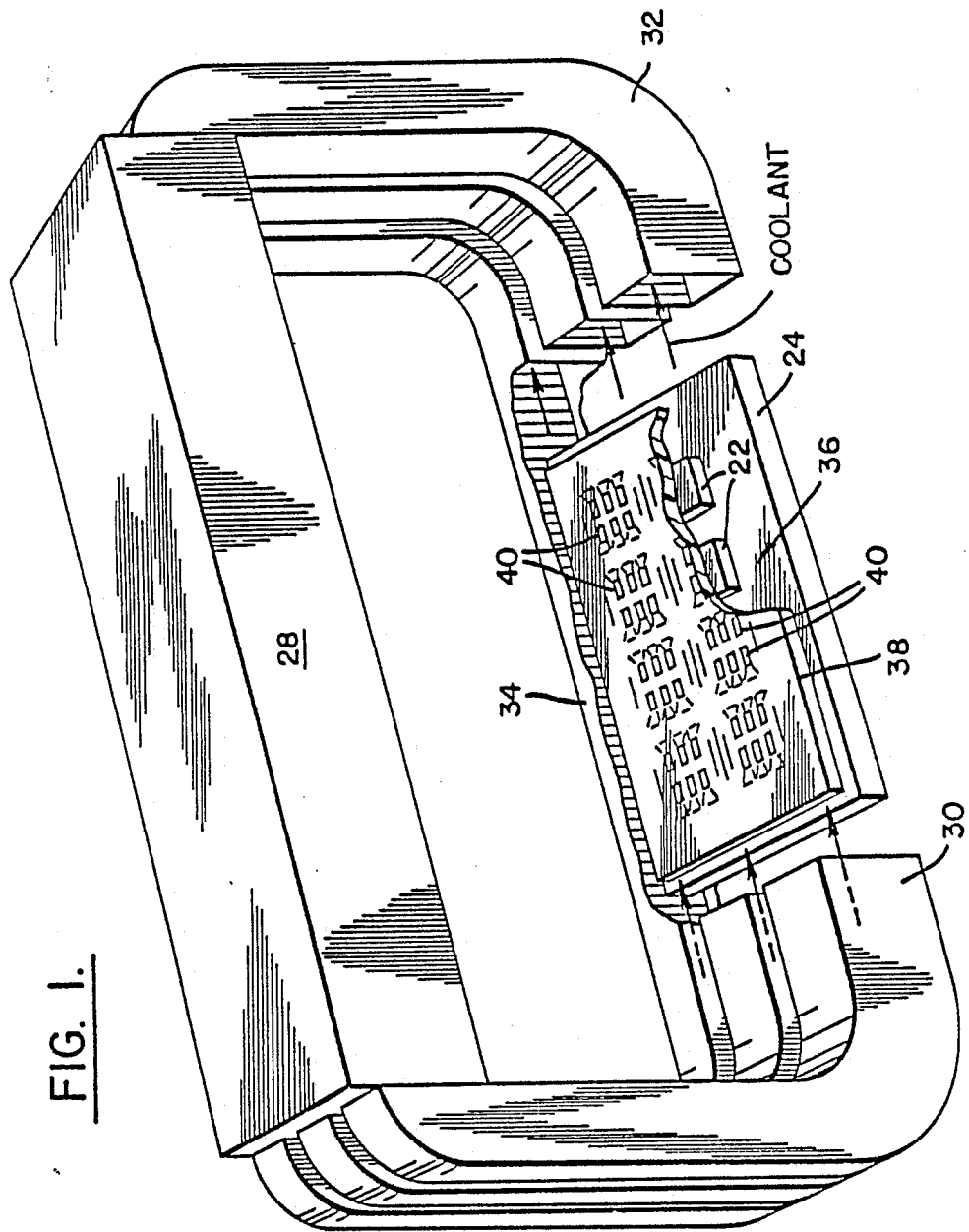
FIG. 1 is an isometric view, partially stylized, of a heat exchanger embodying the invention being used for cooling an array of circuit chips, the figure also showing a manifold for conducting coolant to fins of the heat exchanger.
Figure 2:
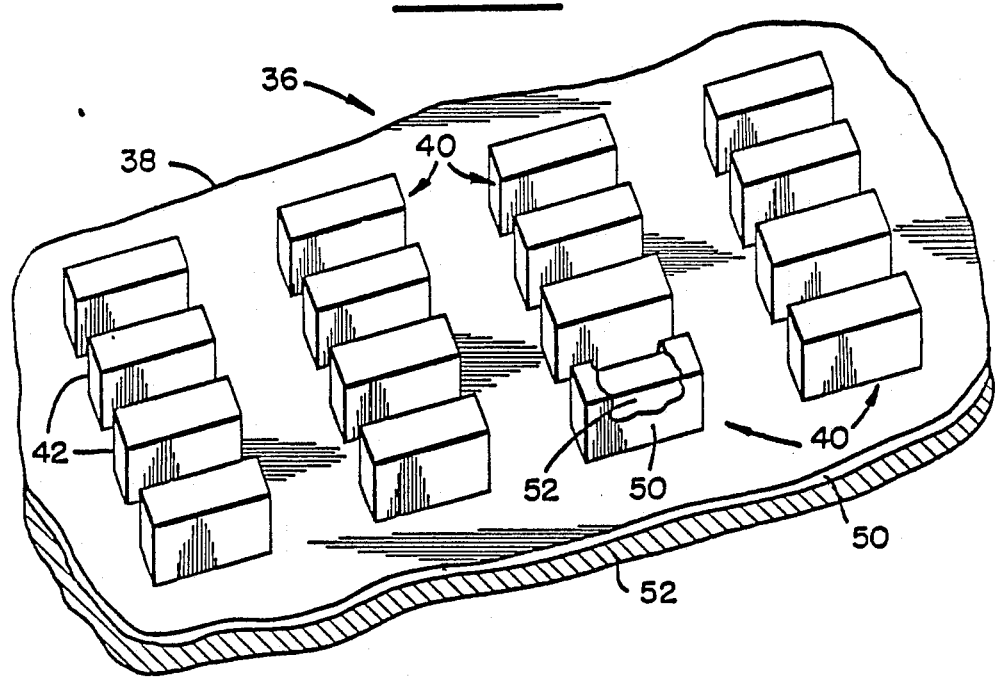
FIG. 2 is an enlarged fragmentary view of a portion of the heat exchanger of the invention.
Figure 3:
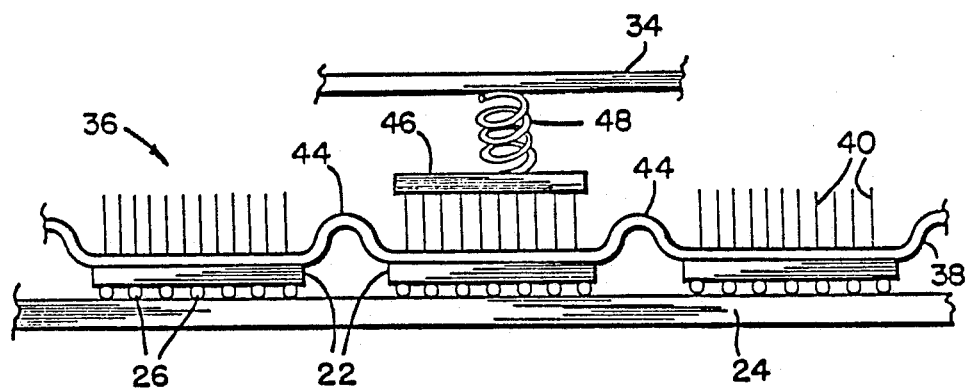
FIG. 3 is a side view, partially schematic, of the heat exchanger of the invention, the view showing corrugations in a sheet of the heat exchanger for improved flexibility.

With reference to FIGS. 1–3, an electronic system 20 is formed as an array of circuit chips 22 disposed on a common substrate 24. Electrical connections between the chips 22 are accomplished by well-known conductors (not shown) within the substrate 24 and a set of soft metal solder ball connections 26 (known as C4's) located between terminals of the chips 22 and the conductors of the substrate 24. Heat generated within the chips 22 by electric currents flowing within the circuits of the chips 22 is dissipated by means of a fluid coolant provided by a chiller 28 and conveyed therefrom to the chips 22 by a supply conduit 30 and a return conduit 32. A duct 34, partially shown in FIG. 1, guides the coolant past the chips 22 between the conduits 30 and 32. The chips 22 of FIG. 1 represent only a portion of the system 20, additional chips (not shown in the figure) also being provided with supply and return conduits (not shown) which conduits in combination with the conduits 30 and 32 constitute a manifold for conducting coolant between the chiller 28 and the electronic system 20.

In accordance with the invention, the cooling of the chips 22 is accomplished more efficiently by the use of a heat exchanger 36 comprising a flexible sheet 38 of thermally conductive material with fins 40 of thermally conductive material extending away from the sheet 38. In FIG. 1, the sheet 38 is shown covering the chips 22, with a part of the sheet 38 being cut away to show partially two of the chips 22. Due to the flexibility of the sheet 38, the heat exchanger 36 covers the chips 22 and the substrate 24 in a manner of a blanket. The flexibility of the sheet 38 provides for the isolation of stress between the chips 22, the stress being associated with the relatively large mass of the fins 40 mechanically connected to the chips. It is noted that the foregoing solder ball connections 26 have a diameter of only 5 mils, and are susceptible to fracture. The foregoing stresses developed at one chip cannot be transmitted via the sheet 38 to another chip because of the flexing action of the sheet 38. This protects the connections 26.

A suitable thermally conductive material for construction of the heat exchanger 36 is a flexible metal, such as copper. The configuration of the fins 40 upstanding from the metal sheet may be referred to as a "metal velvet" because one side of the sheet has a fine fin structure while the opposite side of the sheet is smooth. While the heat exchanger 36 may have relatively large fins for air cooling, the "velvet" effect of the smaller fins for water cooling is advantageous because the smaller fin size, fin thickness and groove width of 50 microns, enhances the transfer of heat from the fins to water.

As shown in FIG. 2, the fins 40 are oriented in a regular array to form grooves 42 between the fins 40 which are aligned along the direction of coolant flow so as to guide the coolant among the fins 40. The fins 40 are located on the sheet 38 only at those locations corresponding to sites of the chips 22. At the locations on the sheet 38 corresponding to spaces between the chips 22, as shown in FIG. 3, it is advantageous to construct a corrugation 44 within the sheet 38 to increase the flexibility thereof to insure a better conformal fit of the underside of the sheet 38 to the top surfaces of the chips 22. In particular, is is noted that the flexibility of the sheet 38 permits the heat exchanger 36 to conform to the individual orientations of the surfaces of the chips 22 for enhanced conduction of heat from each chip 22 to the coolant.

If desired, as shown in FIG. 3, a pressure plate 46 may be applied to the top ends of the fins 40 and pressed against the heat exchanger 36 by a spring 48 secured to the ducts 34 of the cooling manifold. The pressure exerted by the spring 48 is sufficiently small so as to preclude any bending of the fins 40, but is sufficiently large to promote thermal contact between the sheet 38 and the top surface of a chip 22, such as the middle chip depicted in FIG. 3 with the pressure plate 46.

Figure 4:
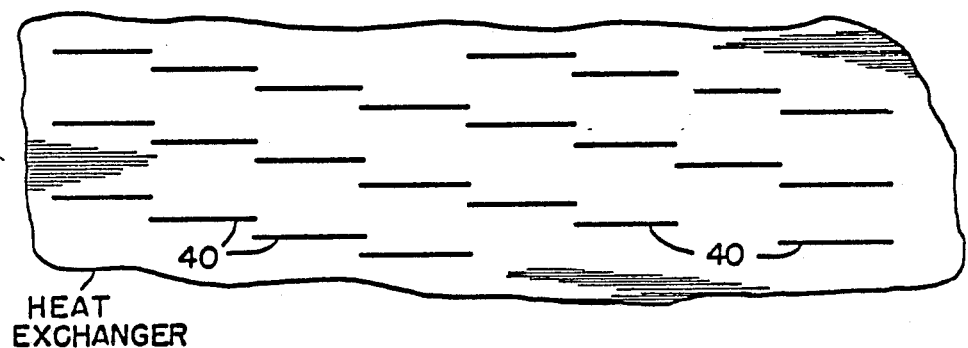
FIG. 4 is a diagrammatic view of a staggered arrangement of fins in an alternative embodiment of the heat exchanger of FIGS. 1–3.

With respect to the arrangement of the fins 40, the fins 40 may be arranged in rows and columns, as shown in FIG. 2, or alternatively, may be located in a staggered array as shown diagrammatically in FIG. 4. In both cases, the orientation of the fins 40 follows the lines of coolant flow so as to provide for good conduction of heat from the fins 40 into the coolant.

In the embodiment of FIG. 2, the spacing between the fins 40 is approximately equal to the thickness of an individual fin, thereby to minimize the build up off any thermal boundary layer within the coolant, as the coolant flows past the fins 40.

As shown In FIG. 2, the material of the heat exchanger may be coated with a coating 50 to protect the material from any corrosive effects of the coolant. The coating 50 is not required with non corrosive coolants. For example, in the case where the coolant is air, a suitable material for the heat exchanger 36 is copper. No coating is necessary because the air is not corrosive. However, in the case where the coolant is water, the copper should be coated with a coating 50 of nickel to prevent corrosion of the copper by the water. In FIG. 2, a portion of one of the fins 40 is partially cut away to show the coating 50 upon a base material 52 of copper. Also, the base material 52 and the nickel coating 50 may be seen in the sectioned portion of the sheet 38. Another suitable material for construction of the heat exchanger 36 is stainless steel. While the stainless steel is not as good a thermal conductor as copper, it is resistant to corrosive coolants, and may be used without a coating.

During the emplacement of the sheet 38 upon the top surfaces of the chips 22, it is preferable to employ a low-temperature soft metal alloy solder between the chip 22 and the sheet 38 for best heat conductivity.

In the event that a lesser thermal conductivity is adequate, then a thin layer of other thermally conductive material may be placed between the chip 22 and the sheet 38, suitable material being a well-known grease or oil with zinc oxide. Other suitable materials include a silicone elastomer which may include small thermally conductive particles such as silicon carbide.

The spacing and sizes of the fins 40 is selected in accordance with the particular coolant to be employed. For example, in the case of a fluorocarbon coolant, the fins 40 can extend away from the sheet 38 a distance of almost one inch, and may be spaced apart with a spacing of one-eighth inch. On the other hand, in the case of a water coolant, the fins may be spaced apart by two mils, and may have a thickness of two mils, the individual fin extending along the direction of coolant flow for a distance of twelve mils.

A particular advantage in the use of the heat exchanger 36 of the invention is the fact that it can be placed on a relatively large array of chips 22, for example an array of 100 chips, without the requirement for any precise dimensional alignment, due to the flexibility of the heat exchanger 36. An additional feature is attained by adhesively securing the perimeter of the sheet 38 to the substrate 24, thereby to hermetically seal all of the chips 22 from the coolant. The thickness of the metal sheet 38 is selected in accordance with the specific material employed in the construction of the heat exchanger 36, a thickness in the range of 1-10 mils being suitable for copper. In the case of square chips measuring 4.5 millimeters on a side, and being arranged with a pitch of eight millimeters, a thickness on the order of 2-3 mils of copper provides good thermal conduction in the fins 40. Between the fin arrays, the Cu should be absent, and the nickel overcoat alone should form a flexible sheet. In the positioning of the fins 40 at the site of a chip 22, typically 50 of the fins are located at the site of one chip 22.

It is noted that, in the construction of the electronic system 20, the chips 22 may be placed on a substrate in the form of a ceramic tile having a size of typically four inches by four inches. For such application, the sheet 38 is made sufficiently large to cover the entire tile, thus greatly facilitating the manufacturing process for construction of the system 20. It is further noted that since both the substrate 24 and the chips 22 (typically fabricated of silicon) are rigid, it is advantageous to employ a heat exchanger which is so constructed as to avoid introduction of stresses and strains between the chips and the substrate so as to avoid cracking the solder ball connections 26. The heat exchanger 36 of the invention does not apply stresses by virtue of its flexible construction.

The heat exchanger 36 is most readily fabricated in a manner analogous to the processes used to fabricate printed circuits. The fabrication steps are as follows. Start with a smooth aluminum mandrel, shaped for the corrugations. Apply a mask, and selectively plate copper fins at each chip location. Overcoat these fins and mandrel by electroless deposition of a thin layer of amorphous nickel. Etch away the mandrel with an alkali solution. Thus, over each chip are Cu fins covered with a layer of nickel. Between the chips is a thin layer of nickel.

Figure 5:
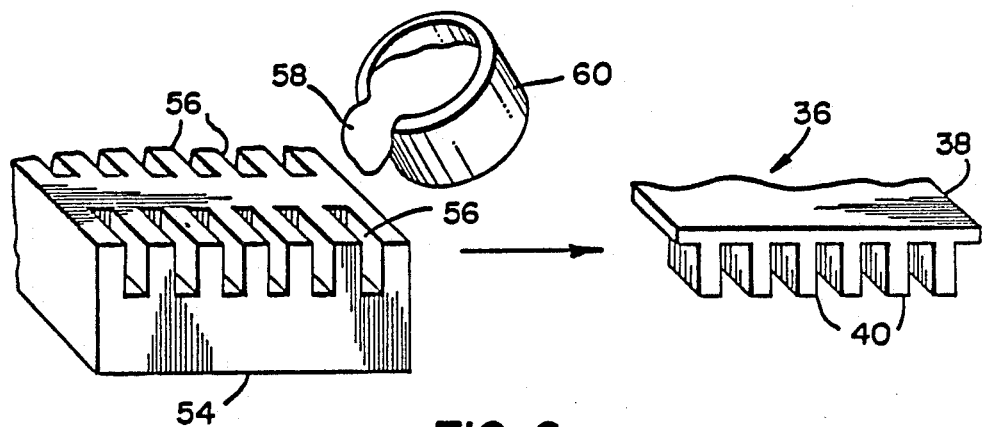
FIG. 5 shows one method of manufacture involving the casting of the metal heat exchanger in a mold.
Figure 6:
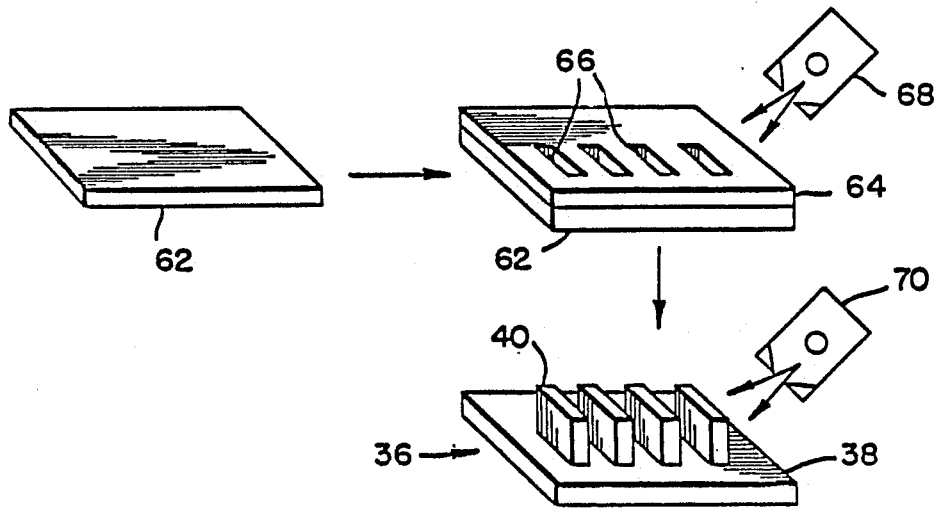
FIG. 6 is an alternative method of manufacture involving masking and deposition of the metal material.

In an alternative process, the heat exchanger 36 is readily manufactured by the processes portrayed in FIGS. 5 and 6. In FIG. 5, a mold 54 is provided with voids 56 having the shape of a fin 40. The heat exchanger 36 is cast by pouring molten metal 58 from a ladle 60 into the mold 54. Thereafter, the mold is cooled to solidify the metal. Upon removal of the mold from the metal, there is attained the heat exchanger 36 with integrally formed fins 40 upon the sheet 38. Only a portion of the mold 54 is shown to facilitate the description. However, it is to be understood that a larger mold would include voids for forming the corrugations 44 in a large sheet of the heat exchanger. Thereby, the entire heat exchanger 36 can be formed in a single manufacturing process.

In FIG. 6, the manufacturing process begins with the preparation of a sheet 62 of thermally conducting material such as copper. A mask 64 is developed upon the upper surface of the sheet 62, the mask 64 being provided with voids 66 having the shape of a fin 40. Thereupon, metal, such as copper, is provided by a source 68 and deposited by chemical vapor deposition to build up fins 40 within the voids 66 of the mask 64. Thereupon, the mask 64 is removed, by conventional means, and a further source 70 is employed for depositing a coating, such as a nickel coating upon the completed assembly to provide the coated sheet 38 and fins 40 of the heat exchanger 36. Corrugations may be placed within the sheet 38 by a mechanical process such as swaging employing a preformed anvil, or similar mechanical form (not shown) to form the corrugations. Here too, the heat exchanger 36 can be fabricated in a sufficiently large size to cover a relatively large array of the chips 22.

Figure 7:
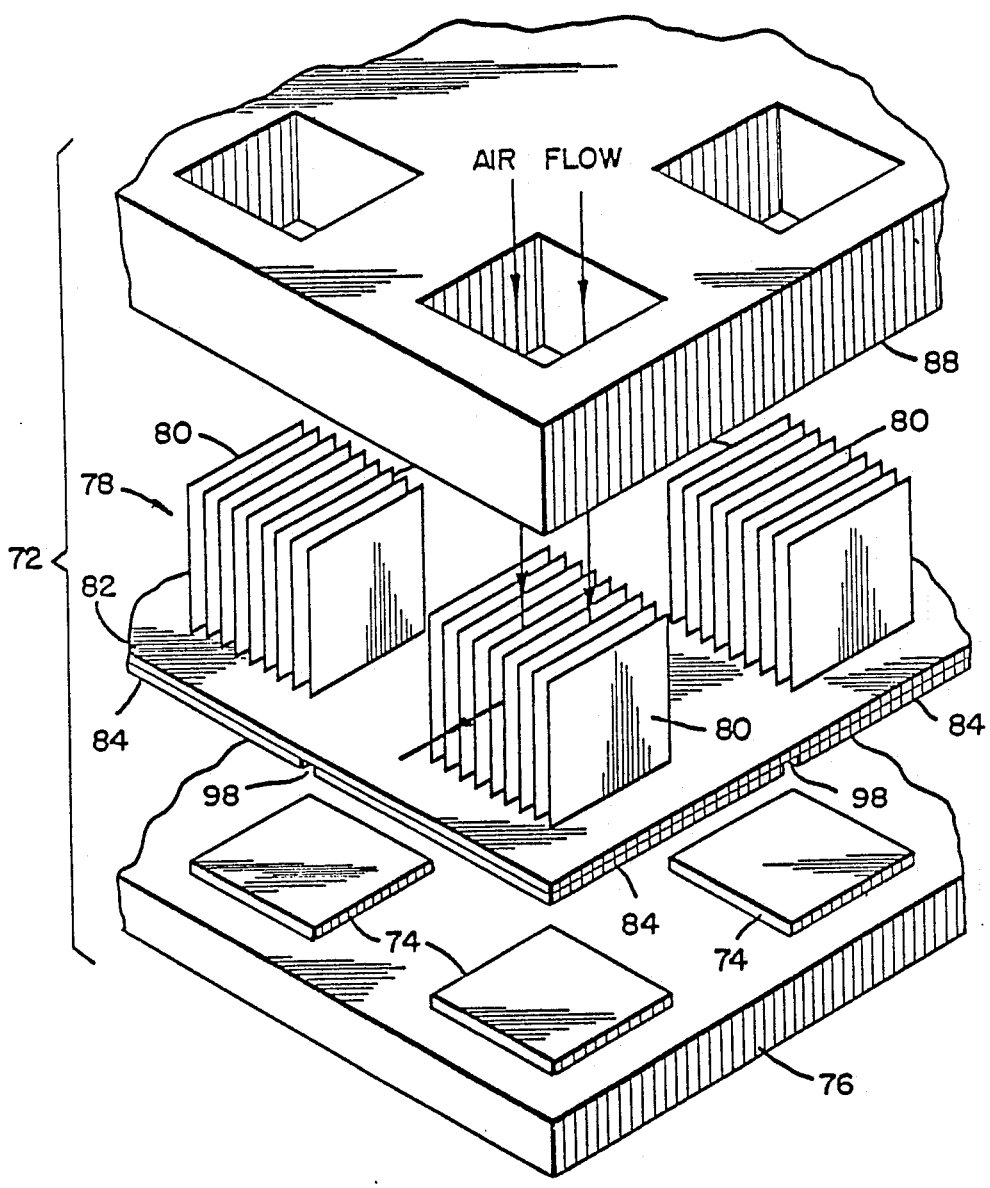
FIG. 7 is an exploded view of an alternative embodiment of the invention wherein pads are placed at the base of cooling fins.
Figure 8:
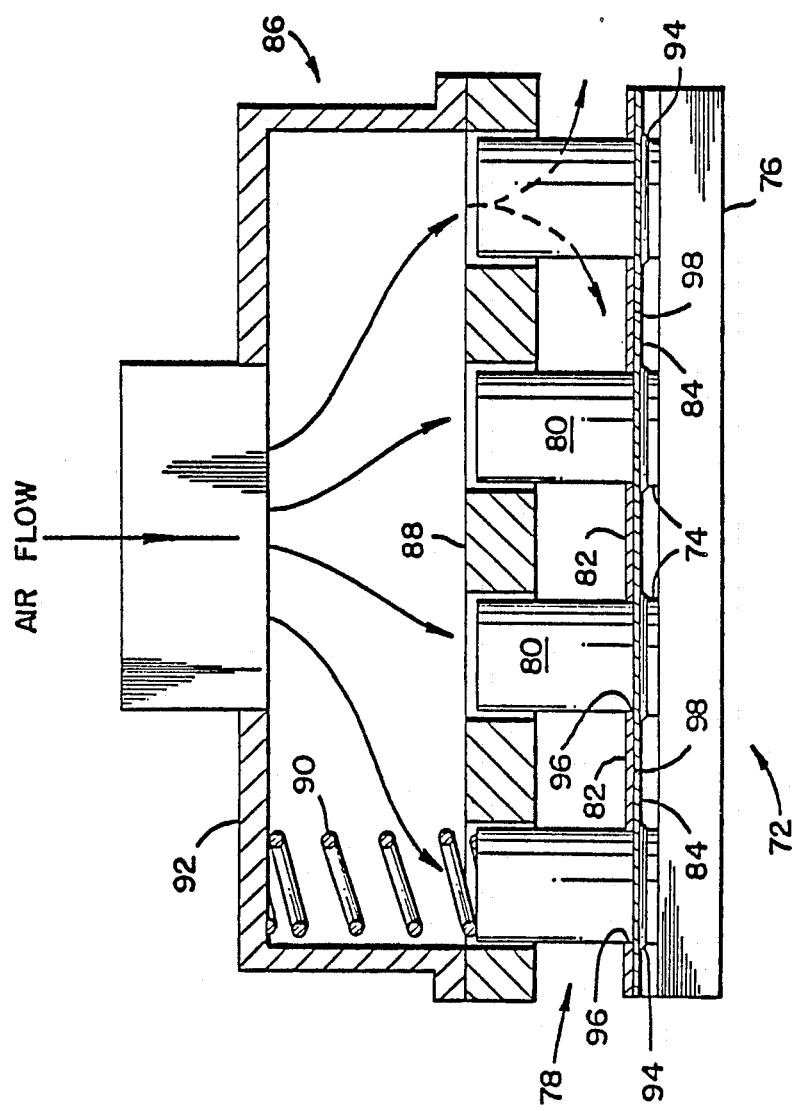
FIG. 8 is an elevation sectional view of the embodiment of FIG. 7.

FIGS. 7-8 show an electronic system 72, similar to the system 20 (FIG. 1) formed as an array of circuit chips 74 disposed on a common substrate 76. Cooling of the chips 74 is accomplished by a heat exchanger 78 constructed in accordance with a further embodiment of the invention wherein separate sets of cooling fins 80 are connected to a flexible sheet 82 with the aid of semi-rigid pads 84 formed of a thermally conductive material such as copper. The fins 80 are formed of copper to provide good conduction of heat from the chips 74 to a streams of cooling air, indicated by arrows. The sheet 82 is formed of an electrically insulating plastic material such as a polycarbonate marketed under the name of "Kapton". The cooling air is conducted via a conduit 86 (FIG. 8) and guided via a plenum 88 to individual sets of the fins 80. Springs 90 (only one of which is shown in FIG. 8) are located between the respective sets of fins 80 and a wall 92 of the conduit 86 for pressing the pads 84 against the corresponding chips 74 to secure good thermal contact between the pads 84 and the chips 74. A layer 94 of a thermally conductive grease is disposed between each pad 84 and its corresponding chip 74 to attain still further thermal conductivity between the chips 74 and the pads 84.

This embodiment of the invention provides for a rigid connection between the fins 80 and the pads 84, the the rigid connection allowing for a much greater height to the fins 80 than is practicable for the fins 40 of FIG. 3. The extra height is particularly advantageous for the case of air cooling wherein a larger contact region, between fin and coolant, should be employed than in the case of liquid coolant. The heat exchanger 78 may be constructed, by way of example, by forming a laminate of copper sheet and the plastic sheet 82, positioning the fins 80 in contact with the copper sheet via apertures 96 (FIG. 8) in the sheet 82, and securing the fins 80 to the copper sheet as by low temperature soldering, 150 degrees Celsius. The soldering is done at a temperature which is sufficiently low so as not to damage the plastic material of the sheet 82. Thereafter, the copper sheet is etched to form troughs 98 which define the individual pads 84 and insulate the pads 84 from each other.

By way of alternative mode of construction, an array of assemblies of pads 84 with their respective set of fins 80 may be formed by conventional means, and then the sets of fins 80 are passed through the apertures 96 in the plastic sheet 82. Thereafter, the pads 84 are bonded to the sheet 82 to form the heat exchanger 78. The flexibility of the sheet 82 allows each of the pads 84 to lie upon the surface of the corresponding chip 74 independently of chip height and orientation relative to the substrate 76. Also, the sheet 82 hermetically seals the chips 74 in the same fashion as has been described above with respect to the embodiment of FIG. 1.

Figure 9:
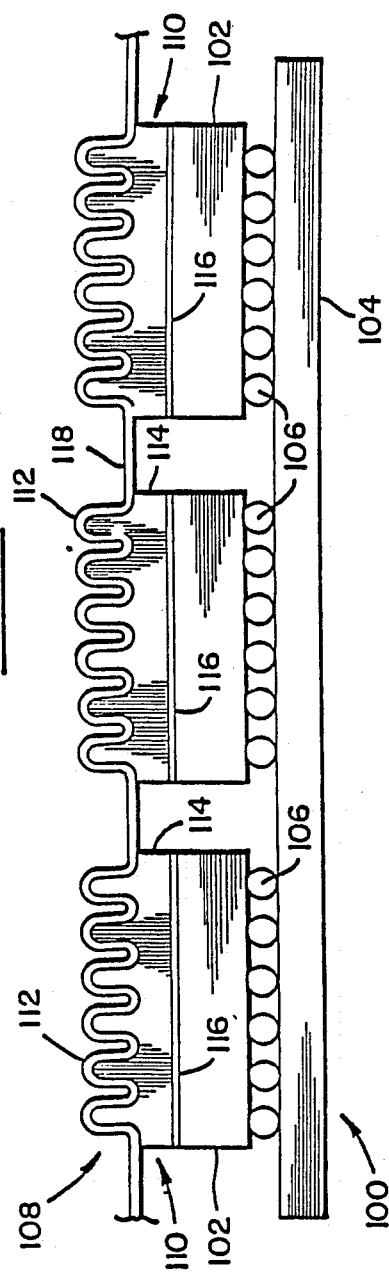
FIG. 9 shows a further construction of the invention wherein a fin and base assembly is secured beneath a flexible sheet.

FIG. 9 shows a simplified view of an electronic system 100 comprising a set of electronic circuit chips 102 disposed on a common substrate 104 containing electrical conductors (not shown) for making electrical connections among the circuits of the chips 102. A set of C4 solder balls serve as connections 106 between terminals of the chip circuits and the conductors of the substrate 104. The system 100 includes a heat exchanger 108 constructed in accordance with a further embodiment of the invention and comprising a set of fin assemblies 110 each of which is formed of a set of fins 112 and a base 114 which supports the fins 112. Each of the fin assemblies 110 rests upon a corresponding one of the chips 102, and is thermally coupled thereto by means of a layer 116 of thermally conductive grease or soft solder or other highly thermally conducting interfaces. A flexible sheet 118 of thermally conductive material, such as amorphous nickel, rests upon the fin assemblies 110 and has undulations which follow the outline of the fins 112 so as to form intimate thermal contact therewith. Each fin assembly 110 is formed of a thermally conductive material such as copper or silicon.

Figure 10:
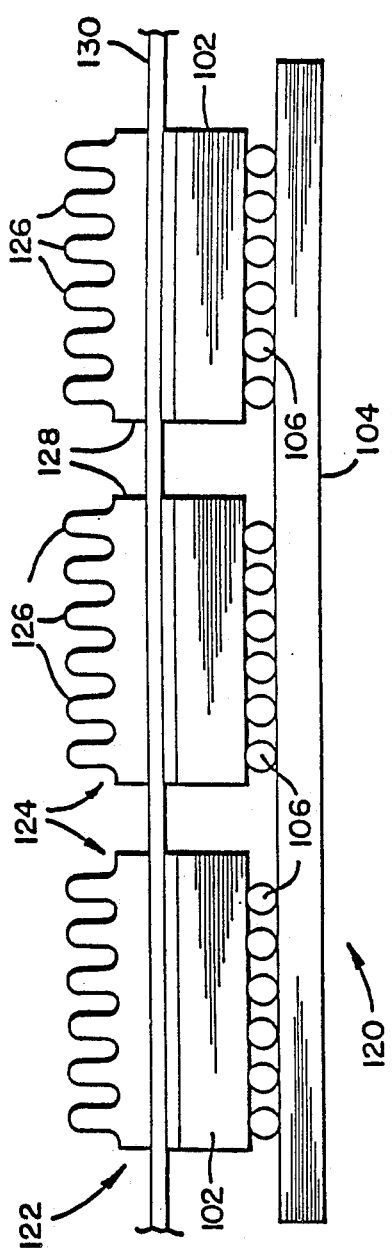
FIG. 10 shows an alternative construction of the invention wherein a fin and base assembly is secured on top of a flexible sheet.

In FIG. 10, there is shown an electronic system 120 which, like the system 100 of FIG. 9, also comprises a substrate 104 with a set of circuit chips 102 connected thereto by connections 106. The system 120 includes a heat exchanger 122 which is an alternative embodiment of the heat exchanger 108 of FIG. 9. The heat exchanger 122 comprises a set of fin assemblies 124 each of which is formed of a set of fins 126 and a base 128 which supports the fins 126. Each of the fin assemblies 124 is positioned above a corresponding one of the chips 102, and rests upon a flexible sheet 130 disposed between the fin assemblies 124 and the chips 102. The base 128 of each fin assembly 124 is thermally coupled through the sheet 130 to the corresponding chip 102 by means of a layer 116 of thermally conductive grease. The sheet 130 is formed of thermally conductive material, such as amorphous nickel. Each fin assembly 124 is formed of a thermally conductive material such as copper or silicon.

In the construction of the heat exchangers 108 and 122 of FIGS. 9 and 10, the fin assemblies 110 and 124 are constructed first, by selective copper plating, and then the amorphous nickel is deposited on an array of the assemblies 110 to form the exchanger 108, or upon an array of the assemblies !24 to form the exchanger 122. The deposition of the amorphous nickel is accomplished with the aid of a mandrel which holds the fin assemblies 110 or 124 in their respective arrays. The nickel is deposited upon an array of fin assemblies and upon the mandrel by electroless deposition, after which the fin assemblies are removed from the mandrel to complete formation of the heat exchanger 108 or 122. With both the embodiments of FIGS. 9-10, the sheets of the heat exchangers hermetically seal the chips 102. In both embodiments, the bases 114 and 128 rigidly support their respective fins 112 and 126 so as to accommodate short or tall fins as may be required for a particular coolant such as air or water. Also, in both embodiments, the flexibility of the respective sheets 118 or 130 permit the fin assemblies 110 or 124, respectively, to be individually positioned in accordance with the height and orientation of the respective chips 102 relative to the substrate 104. With both embodiments, a coolant is to be delivered by a conduit (not shown) such as that disclosed previously in FIGS. 1 or 8.

The foregoing embodiments of the invention employ the inventive concept of providing a flexible mechanical connection between a heat exchanger and circuit chips so as to enable the supporting structure of a set of cooling fins to make intimate thermal contact with a surface of a chip independently of the orientation and height of the chip relative to both a substrate and the other chips. This concept will be further demonstrated with respect to additional embodiments of the invention to be disclosed in FIGS. 11-14 and 15-17.

With reference to FIGS. 11-14, there is presented a set of steps in the construction of a circuit assembly 132. The assembly 132 comprises a single circuit chip 134 supported by a substrate 136, and cooled by a heat exchanger 138 having a set of fins 140 supported on a base 142. A frame 144 comprises circumferential sidewalls 146 positioned for encircling the substrate 136, and further comprises a flexible sheet 148 supported by the sidewalls 146 and bonded to flanges 150 which are directed inwardly from the tops of the sidewalls 146. The base 142 is bonded to the sheet 148. Upon a joining of the frame 144 to the substrate 136, the sheet 148 is sufficiently flexible to conform to the top surface to the single circuit chip 134 for alignment of the base 142 with the chip 134.

The sheet 148 is fabricated of a thermally conductive material such as aluminum, or copper and contacts both the chip 134 and the base 142 to provide for the conduction of heat from the chip 13 to the heat exchanger 138. By way of example in the construction of the heat exchanger 138, the fins 140 may be formed as a square array of pins wherein each pin has a diameter of 93 mils and a height of 1.25 inches. The base 142 is approximately 90 mils thick and has a central stud portion which extends downward an additional 90 mils. The base 142 and the fins 140 upstanding therefrom are formed as an integral assembly of a thermally conductive material such as copper or alluminum.

Figure 11:
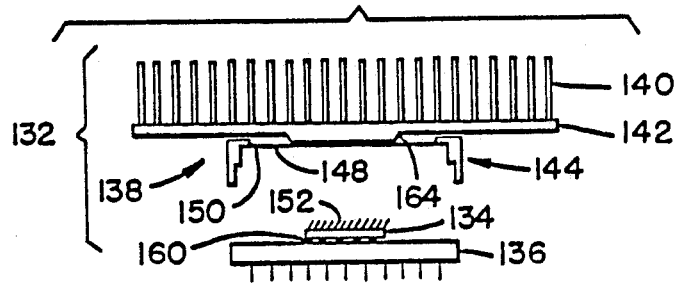
FIGS. 11–14 show steps in the construction of a further embodiment of the invention wherein a base and fin assembly make contact with a flexible sheet held by a frame above a circuit chip.
Figure 12:
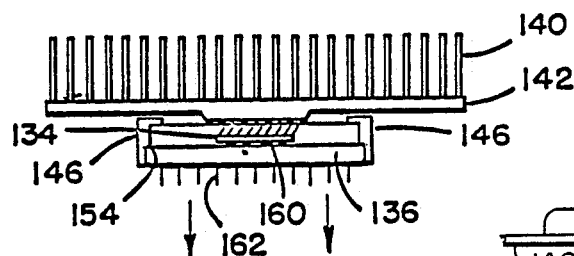

The construction begins, as shown in FIG. 11, by positioning the heat exchanger 138 with the frame 144 and the sheet 148 attached thereto above the substrate 136 and the chip 134 thereon. A layer 152 of grease is applied to the top surface of the chip 134, and then the frame 144 is lowered to contact the peripheral portions of the substrate 136, as shown in FIG. 12. The substrate 136 sets within shoulders 154 formed within the sidewalls 146. In FIG. 13, the heat exchanger 138 is lowered still further, with flexing of the sheet 148, to squeeze the grease layer 152. The layer 152 between the sheet 148 and the chip 134 provides for thermal conduction therebetween upon a pressing of the base 14 against the sheet 148 and the chip 134.

Figure 13A:
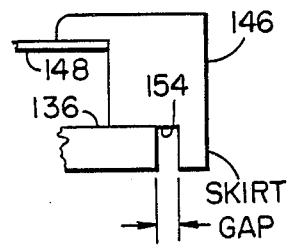
Figure 13:
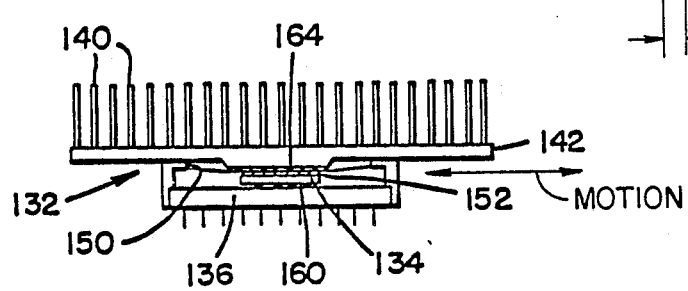

In accordance with a feature of the invention, the shoulders 154 are enlarged to provide a gap (as shown in FIG. 13A) between the peripheral edge of the substrate 136 and the interior surfaces of skirt portions of the frame sidewalls 146. The gap provides space to allow for a transverse movement of the frame 144 and the sheet 148 relative to the substrate 136 and the chip 134 carried thereon. As a step in the construction process, the transverse motion is applied during the squeezing of the grease to provide a substantial reduction in the thickness of the grease layer 152 over that which can be attained by squeezing without transverse motion. For example, it has been observed that a joining of the sheet 148 to the chip 134 by a process of squeezing the grease without transverse motion results in a thickness of approximately 10 mils to the grease layer 152. However, by use of both squeezing and transverse motion simultaneously, the thickness of the layer 152 is reduced to approximately one mil resulting in greatly improved thermal conductivity between the chip 134 and the sheet 148.

As shown in FIG. 12, as the sheet 148 is first brought into contact with the grease layer 152, an output bulge appears in the sheet 148 due to pressure against the layer 152. The bulge in the sheet 148 is reduced as the layer 152 is reduced in thickness ( FIG. 13) by the squeezing and transverse motion. A small space is present between the base 142 and the tops of the sidewalls 146 to allow for the vertical positioning of the base 142 relative to the chip 134, which space may be filled with adhesive as will be disclosed with reference to FIG. 14. The upward bulge in the sheet 148 introduces a tension in the sheet 148 which is advantageous for developing a compressive force across C4 solder-ball connections 160 between the chip 134 and conductors (not shown) in the substrate 136. Such compressive force is useful in preserving integrity of the electrical connection 160, particularly in the case of an adverse environmental situation such as vibration of electronic equipment incorporating the circuit assembly 132.

Figure 14:
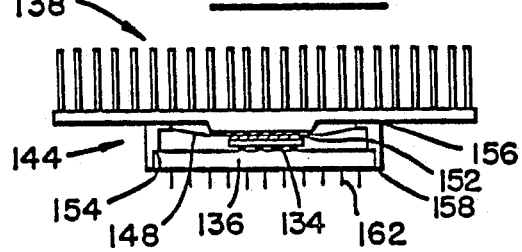

Finally, as shown in FIG. 14, the base 142 is bonded at 156 to the tops of the sidewalls 146 to rigidly secure the heat exchanger 138 in position relative to the chip 134. Bottom skirt portions of the sidewalls 146 may also be bonded at 158 to the substrate 136 to hermetically seal the chip 134.

While only one chip 134 is shown in the circuit assembly 132, it is understood that the circuit assembly 132 may include plural chips, to be described hereinafter, each of which is connected by C4 solder-ball connections 160 to conductors (not shown) within the substrate 136, thereby to function in the manner of the system 20 of FIG. 1. Pins 162 extending downward from the substrate 136 permit connection with other modules (not shown) of the circuit assembly. The heat exchanger should be divided into plural segments to closely contact each of a plurality of chips. Separate heat exchangers would then be mounted on the frame 144 with the respective stud portions of the bases being positioned in registration with the corresponding chips, and bonded to the sheet 148 with a thermal solder bonds such as a thermal solder bond 164 shown for the assembly 132 in FIG. 11.

Figure 15:
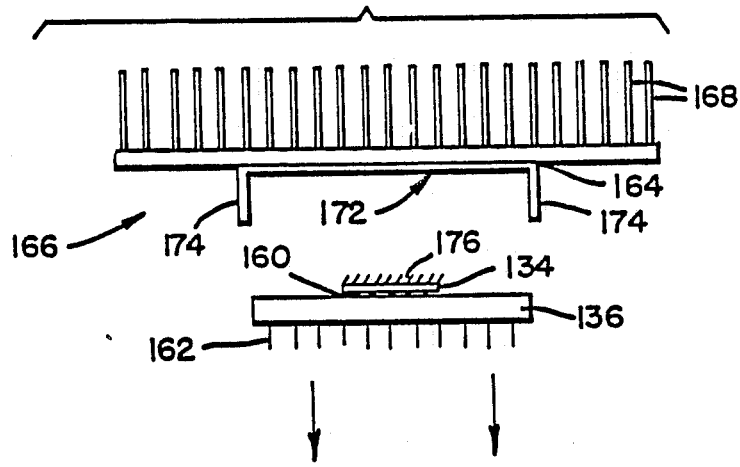
FIGS. 15–17 show steps in the construction of an alternative embodiment of the invention wherein a base and fin assembly make contact via a thermally conductive grease held by a frame upon a circuit chip.
Figure 16:
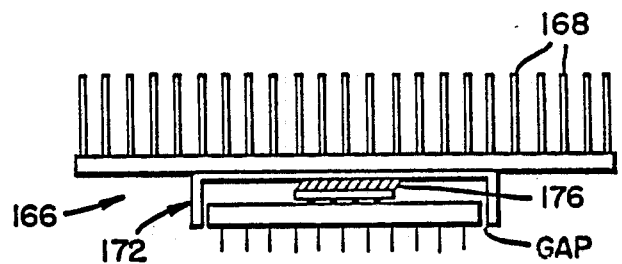
Figure 17:
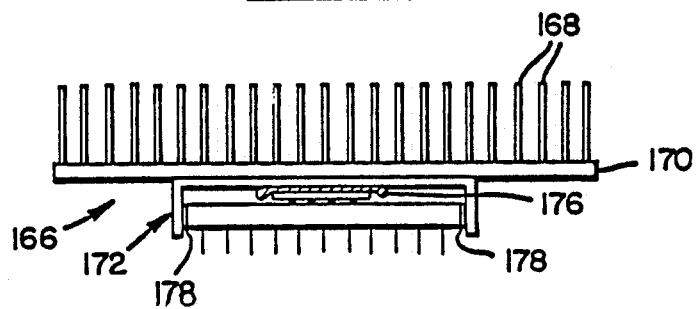

FIGS. 15-17 also show the chip 134 supported by the solder ball connections 160 upon the substrate 136, as shown above in FIGS. 11-14. Cooling is provided by a heat exchanger 166 comprising a set of fins 168 upstanding from a base 170, the base 170 being secured to a cap-shaped frame 172 having sidewalls 174 positioned for enveloping the periphery of the substrate 136. Connection of the heat exchanger 166 to the circuit chip 134 for removal of heat therefrom begins, as shown in FIG. 15, by positioning the frame 172 above the chip 134 and in registration with the substrate 136. A thick layer 176 of a thermally conductive grease is placed on the top surface of the chip 134. Then, as shown in FIG. 16, the heat exchanger 166 is lowered to bring the sidewalls 174 alongside the peripheral portions of the substrate 136. During the step of lowering the heat exchanger 166, the grease of the layer 176 is extruded between the bottom surface of the frame 172 and the top surface of the chip 134.

To facilitate the extrusion of the grease, and to reduce further the thickness of the resultant configuration of the layer 176, a transverse motion is introduced between the frame 172 and the substrate 136 so as to attain a thin thickness, such as the aforementioned thickness of one mil. A gap (FIG. 16) between frame sidewalls 174 and the substrate 136 is sufficiently wide to allow for the transverse movement during the extrusion of the grease in the layer 176.

The sidewalls 174 make a loose fit to the substrate 136 so as to enable an alignment of the frame 172 with the chip 134 to ensure good thermal contact therewith. Thus, it is appreciated that the initial connection between the heat exchanger 166 and the chip 134 is by a flexible mechanical connection provided by the grease layer 176 and the loose fit between the sidewalls 174 and the substrate 136. After alignment of the heat exchanger 166 is completed, the connection of the heat exchanger 166 to the chip 134 and the substrate 136 is completed, as shown in FIG. 17, by placing an adhesive 178 in the gap between the sidewalls 174 and the substrate 136 to hermetically bond and rigidly secure the sidewalls 174 to the substrate 136, so as to maintain the alignment and thermal conductivity.

It is noted that the foregoing methods of construction provide the good thermal bonding associated with a custom fitting of a heat exchanger to a circuit chip. Such custom fitting is accomplished as follows. First, connect the chip to a beam lead frame, chip carrier or similar support. Second, attach a fin to the chip by a flexible joint, such as thermally loaded silicone or grease. Third, pour plastic around the chip and the fin base. Depending on the rigidity of the plastic, and on jolts received by the fin, it might be desirable to mechanically protect the chip with a spacer. In some cases it may be desirable to assemble the fin later. First, attach the chip to its carrier. Second, attach a thermal stud to the chip by a flexible joint. Third, pour plastic around the chip and the base of the stud. Fourth, attach the fin to the outside of the stud. For example, use a good thermal bond such as a low melting alloy. Such a procedure maintains the fin or heat exchanger in secure thermal contact with the chip.

Figure 18:
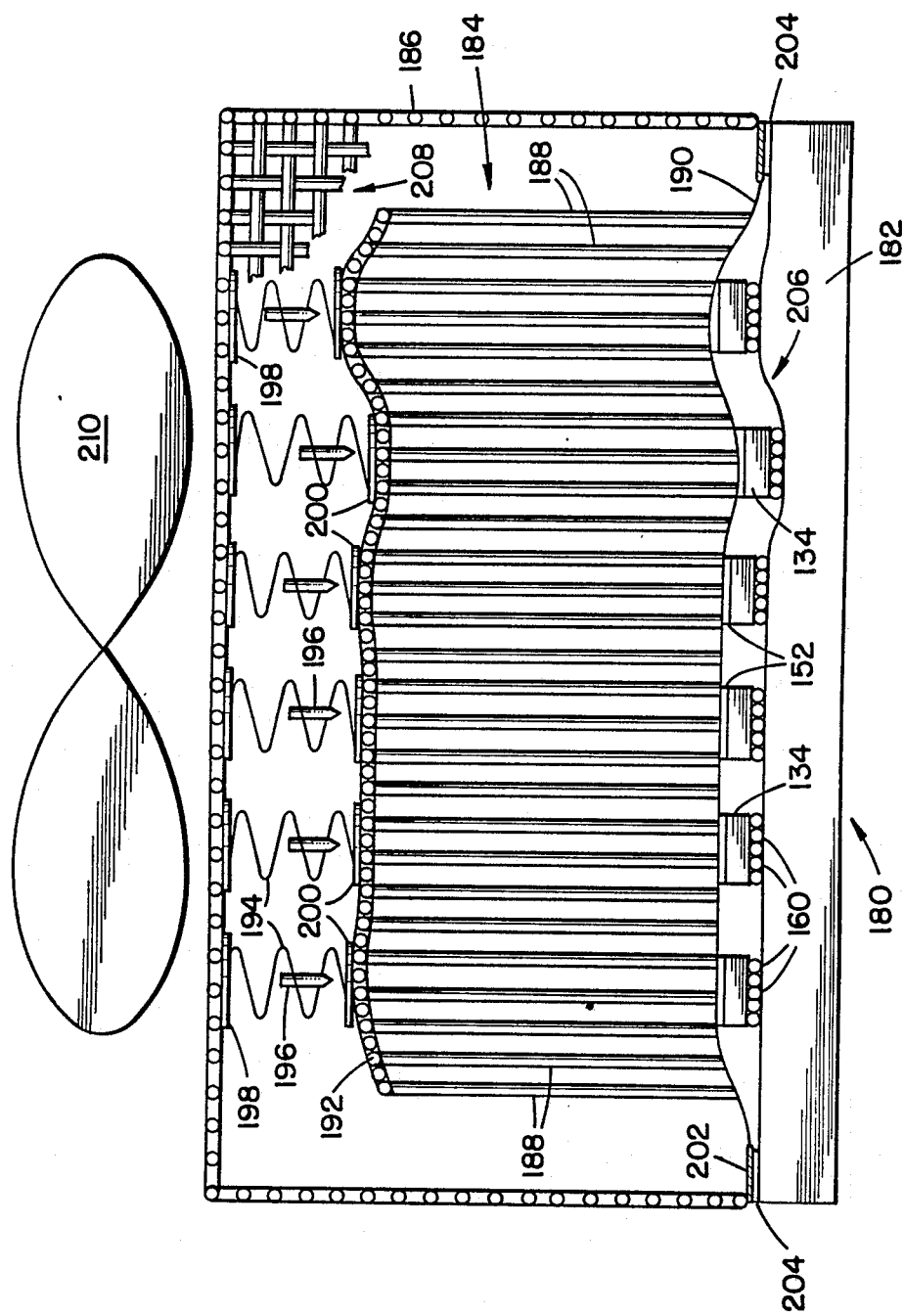
FIG. 18 is a diagrammatic view of a further embodiment of the invention wherein a base and fin assembly make contact with a flexible sheet via a thermally conductive grease simultaneously to several circuit chips arranged in an array upon a common substrate, this embodiment including a set of springs anchored to a cage enclosing a finned heat exchanger.

FIG. 18 shows a further embodiment of the invention wherein a circuit assembly 180 comprises several or more circuit chips 134 supported by a common substrate 182. The chips 134 are cooled by a common heat exchanger 184 which extends across an array of the chips 134 and thermally contacts each of the chips 134. A cage 186 is supported by the substrate 182, and encloses the chips 134 and the heat exchanger 184. Each of the chips 134 is connected by ball connections 160 to conductors (not shown) within the substrate 182 to accomplish electrical interconnection among the circuits of the various chips 134 whereby the chips 134 together form an electronic system such as the system 20 of FIG. 1. This embodiment of the cooling system may be referred to as FlexiCap because of the use of a flexible cap.

The heat exchanger 184 is composed of an array of fins 188 disposed in parallel relationship to each other and connected together thermally by a flexible metallic sheet 190 at the bottom ends of the fins 188, the sheet 190 providing physical support for the fins 188. The sheet 190 is physically and thermally connected to the top surfaces of the chips 134 by layers 152 of thermally conductive grease. The top ends of the fins 188 are mechanically connected by a flexible harness 192 which stabilizes the physical configuration of the heat exchanger 184, and maintains the spacings between the fins 188 even in the presence of adverse conditions of an external environment such as a vibration of the assembly 180.

A set of springs 194, including dampers 196 mounted therein for damping any vibration which may be present, are located between the top wall of the cage 186 and the upper ends of the fins 188 for supplying a continuous compressive force upon the ball connections 160. The springs 194 are secured at their upper ends by plates 198 to the top wall of the cage 186, and at their lower ends by plates 200 to the harness 192 and the upper ends of fins 188. By way of example, three fins 188 are shown in registration with each of the chips 134, the same three fins 188 being in registration with a plate 200 so as to communicate a spring force of a spring 194 to the ball connections 160 of a corresponding chip 134. The sheet 190 is provided with a peripheral rim 202 which facilitates a positioning of the sheet 190 during manufacture of the assembly 180, and also serves as a means for anchoring the edges of the sheet 190 to the substrate 182, such anchoring being provided, by way of example, by use of an adhesive at 204.

The flexibility of the sheet 190 and of the harness 192 permit parallel displacements among the fins 188 so as to accommodate undulations, such as undulation 206, in a surface of the substrate 182. The undulation 206 is shown greatly exaggerated in order to facilitate a description of the undulation, it being understood that, in practice, such undulations have a size in the range of one to a few mils, and are caused by vertical displacements of chip and substrate. By way of example, assuming a chip 134 to have a length of seven millimeters, with a separation of four millimeters between facing edges of successive chips 134, the one-mil displacement gives rise to a bending of the sheet 190 with a relatively large radius of curvature on the order of approximately one meter. Thus, it can be appreciated that the surfaces of the sheet 190 and of the substrate 182 are essentially flat, even in the presence of an undulation. However, in terms of the one-mil thickness of the layers 152 of thermally conductive grease, such undulation can be significant. Therefore, the capacity of flexure in the sheet 190 is important to insure the one-mil thickness to the layers 152 even in the presence of an undulation such as the undulation 206.

The cage 186 may be formed, by way of example, of a metal screen formed of woven metallic threads. The use of metallic threads in the construction of the cage 186 is useful for providing electromagnetic shielding between the circuitry of the assembly 180 and another such assembly (not shown).

The cage 186 should be open, as indicated in a fragmentary view of such screen at 208, to permit airflow, and rigid enough to shield the fins against objects in an external environment, which objects might strike the fins. Some examples of fabrication are a molded plastic grid, or metal rods, or stiff metal wires. The cage 186 has apertures sufficiently large to permit free flow of cooling air through the cage 186. Such free flowing air may be provided by a fan 210 positioned outside the cage 186 and directing cooling air through the walls of the cage 186 to flow between the fins 188 to extract heat therefrom. Various baffles and conduits (not shown in FIG. 18) may be employed for directing the air from the fan 210 via the fins 188.

The harness 192 may be formed of an open grid of plastic material which allows airflow and provides a moderate degree of flexibility. A soft plastic material, such as polyethylene, is preferred for construction of the harness 192 because such soft plastic material can be pressed against the upper ends of the pins 188 with a resultant deformation of the plastic material in the form of troughs (not shown) which conform the harness to the upper ends of the fins 188, thereby to lock the fins 188 into their respective positions on the harness 192. While the harness 192 can be fixed to the fins 188 initially by means of adhesive, the steady pressure of the springs 194 maintain the connection between fins 188 and harness 192 by the deformation of the plastic material at the upper ends of the fins 188. The individual strands of the harness 192, which strands are directed in crossed relation to each other, may be oriented in parallel and perpendicular directions relative to the fins 188, or may be angled, such as at a 45 degree angle, relative to the directions of the fins 188. The openings in the harness 192 are sufficiently large to allow for the free flow of air from the fan 210 through the harness to the fins 188.

Figure 19:
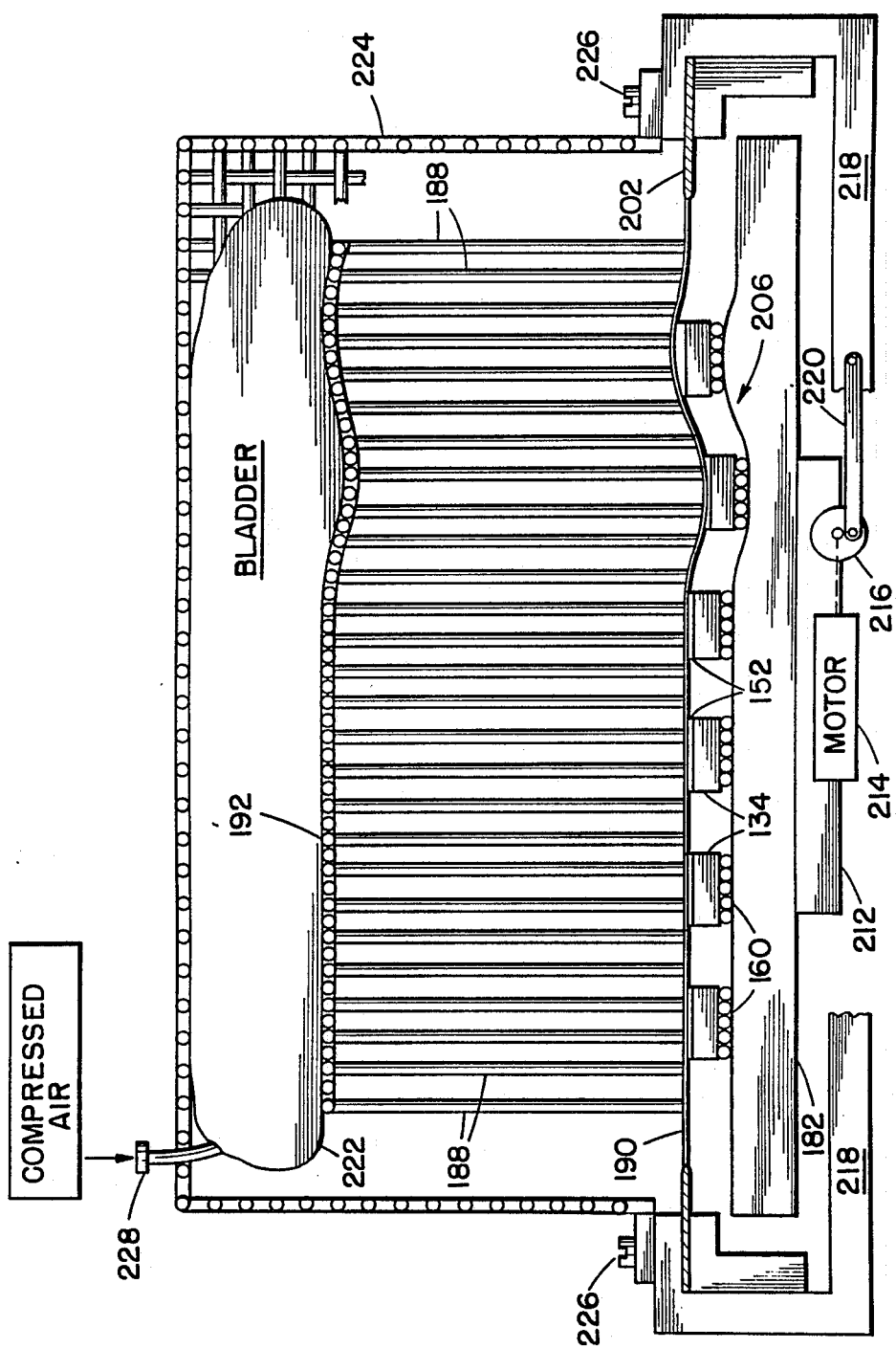
FIG. 19 shows diagrammatically an intermediate step in the construction of the embodiment of FIG. 18 by use of a pressurized air bladder and a motor for imparting transverse motion between the flexible sheet and the circuit chips to minimize thickness of layers of thermal grease connecting the sheet with the individual circuit chips.

FIG. 19 shows a step in the construction of the circuit assembly 180 of FIG. 18. In the steps of construction, the heat exchanger 184 is assembled to the array of chips 134 prior to the assembly of the spring 194 and the cage 196. After connection of the circuit chips 134 to the substrate 182, the layer 152 of thermally conductive grease is applied to the top surfaces of each of the chips 134. Thereafter, the heat exchanger 184 is placed on top of the chips 134. Then, pressure is applied against the fins 188 to urge the sheet 190 against the chips 134 to reduce the thickness of the layers 152, the application of pressure being done concurrently with the introduction of a transverse motion between the sheet 190 and circuit chips 134.

As shown in FIG. 19, the substrate 182 is carried by a base 212 which also supports a motor 214 and a crank 216 which is rotated by the motor 214. A clamp 218 grips the rim 202 of the sheet 190, and is connected by an arm 220 to the crank 216. The joining of the arm 220 to the crank 216 and to the clamp 218 is accomplished by pivotal connections at opposed ends of the arms 220. Upon activation of the motor 214, rotation of the crank 216 imparts translatory motion to the clamp 218 relative to the base 212. Thereby, the clamp 218 pulls and pushes the sheet 190 across the grease layers 152 on respective ones of the circuit chips 134. An air bladder 222 is placed on top of the fins 188, and is secured in position by a cage 224 secured by well-known means, such as bolts 226 to the clamp 218. The bladder 222 is inflated via an inlet tube 228 from a source of compressed air. The cage 224 translates with the clamp 218 and the sheet 190 so as to apply pressure via the fins 188 to the sheet 190 concurrently with the translatory motion of the sheet 190 relative to the chips 134. This reduces the thicknesses of the layers 152 to the desired thickness of approximately one mil. The bladder 222 is removed during a latter stage in the construction of the embodiment of FIG. 18 to provide space for a free flow of cooling air.

With respect to the harness 192, it is advantageous to install the harness on the top ends of the pins 188 prior to installation of the bladder 222. Thereby, the pressure in the bladder 222 aids in securing the harness 192 to the tops of the fins 188 while the grease layers 152 are being formed to the proper thickness.

After completion of the formation of the layers 152 with the desired layer thickness, the cage 224 and the bladder 222 are removed. The harness 192 and the top ends of the fins 188 are ready to receive the bottom plates 200 of the springs 194. The springs 194 with their dampers 196, their bottom plates 200 and their top plates 198 are then installed atop the array of fins 188, and are secured in position by emplacement of the cage 186 upon the substrate 182. It is noted that the hydrostatic pressure of the inflated bladder 222 introduces greater pressure upon the grease layers 152 than do the springs 194. The springs 194 are compressed by the top wall of the cage 186 a sufficient amount to introduce relatively small forces on the ball connections 160, the forces on the ball connection 160 being sufficient to maintain compression of the connections 160 even in the presence of a vibration of the assembly 180. This insures integrity of the connections 160. Securing of the rim 202 of the sheet 190 to the substrate 182 by an adhesive at 204 is accomplished prior to, or contemporaneously with, the emplacement of the cage 186 upon the substrate 182.

Figure 20:
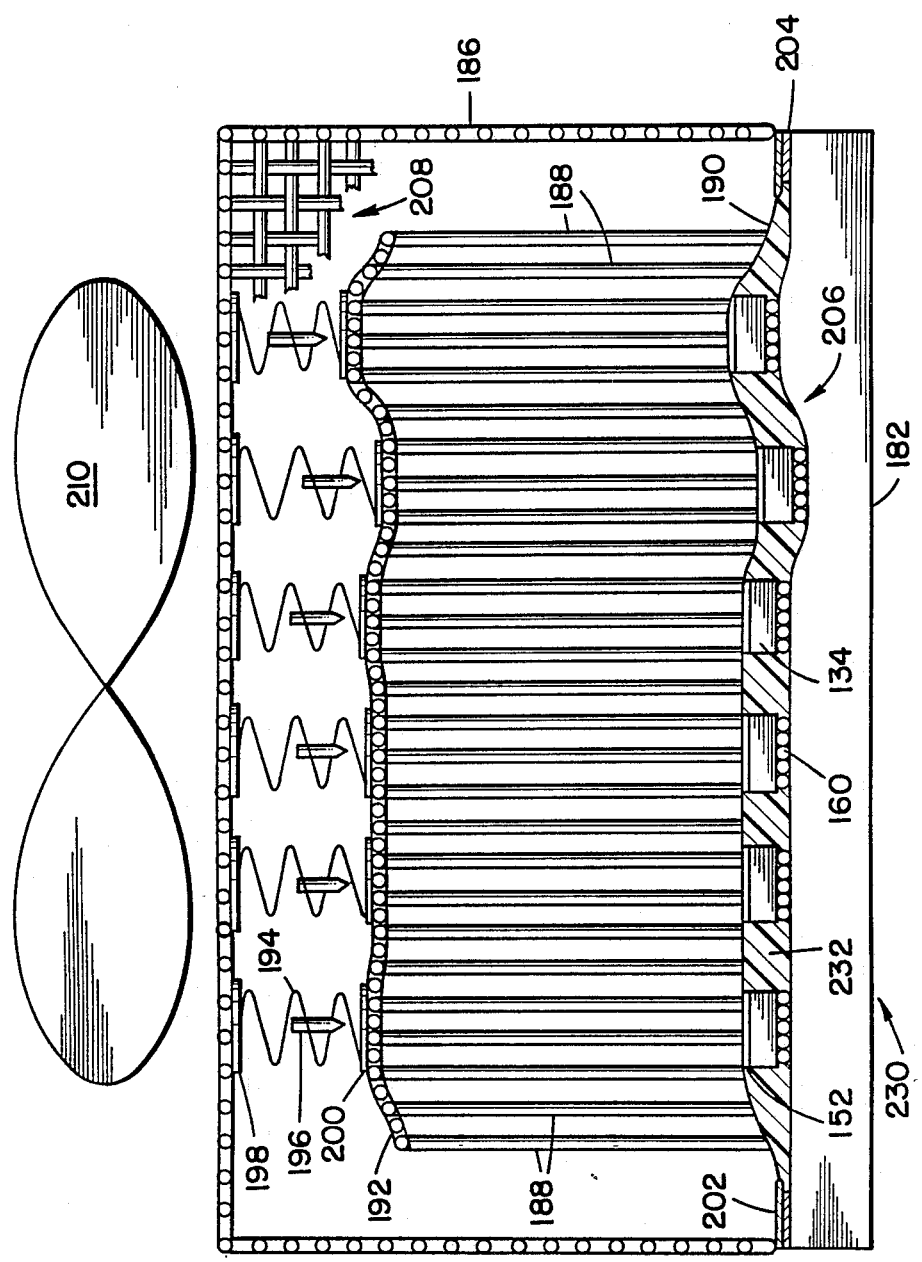
FIG. 20 is a diagrammatic view of an embodiment similar to that of FIG. 18, but including a dimensionally stable filler, such as a thermally conductive grease, disposed in voids between the circuit chips for retaining the flexible sheet in position.

FIG. 20 shows a circuit assembly 230 which has the same construction as the assembly of FIG. 18, except for the interposition (in FIG. 20) of a filler material 232, preferably inelastic material such as the aforementioned thermally conductive grease, Advantageously, the material 232 can be applied as a liquid at elevated temperatures, which liquid then congeals at lower temperature to provide an inelastic substance. The material 232 is advantageous in securing the sheet 190 in a fixed position relative to the substrate 182 even in the presence of vibration or mechanical shock to the assembly 230 introduced by an external environment. The dampers 196 also aid in preventing the loss of a compressional force on the ball connectors 160 during such vibration by preventing the development of any resonance in the vibratory modes of the spring 194. While the bladder 222 (FIG. 19) is inflated, the filler material 232 flows in the spaces between the circuit chips 134. Thereby, the dimensions of the filler material 232 are established while the sheet 190 is under pressure from the bladder 222. Upon removal of the bladder 222, forces of the sheet 190 against the chips 134 are retained, at least in part, by the presence of the filler material 232. It is noted that any attempt of the sheet 190 to lift away from the substrate 182 would induce a vacuum between the sheet 190 and the filer material 232. Accordingly, the filler material 232 tends to retain the sheet 190 in the same position as was present during inflation of the bladder 222.

FIG. 21 shows a circuit assembly 234 which has many of the constructional features of the circuit assembly 180 of FIG. 18, but differs from the circuit assembly 180 in that the fins 188 are clustered in separate groups of fins upstanding from pedestals 236 on the sheet 190. The pedestals 236 are fabricated of the same metal as the fins 188, and may be formed integrally by a molding technique, or may be bonded to the base by conventional techniques, such as welding. Thereafter, each pedestal is bonded to the sheet by a conventional technique, such as soldering. The pedestals 236 are useful in providing additional rigidity to the mounting of the fins 188 to the sheet 190. Due to to the additional rigidity, the harness 192 may not be required, but is recommended in the event that severe environmental conditions, such as excessive vibration, are present.

The small solder ball connections 160 are fragile. Improper design might subject them to excessive stresses and strain during mechanical shock and vibration. This is prevented by the following features. The harness 192, the filler material 232, the damper 196, and the springs 194 further counteract shock and vibration. These elements keep the small solder ball connection under continuous compression. It is noted that aluminum has a relatively high ratio of thermal conductivity to mass, compared to other common metals, and also is amenable to common techniques of fabrication. In addition, tapered pin fins and fins having related geometries minimize the fin material required for good air cooling. For example, an array of cooling fins may be constructed as an array of fin tapered aluminum pin fins, bonded upon an aluminum sheet. This construction minimizes inertia forces. Also, the sheet and the thin pin fins are each transversely flexible. During shock and vibration, they each can bend slightly, which further reduces the peak inertial stress otherwise transmitted to the chips.

By way of example, a commercially available pin fin array employs aluminum pins of type 1100 aluminum having a thermal conductivity of 218 watts per degree centigrade per meter, and a mass density of 2.7 kilograms per liter. Each pin is 31.8 millimeters long and 1.78 millimeters of uniform diameter. The pins are bonded in a square grid, with a pitch of 4.17 millimeters, directly onto to an aluminum sheet having a thickness of 0.45 millimeters. The area of the pins plus sheets is 11.4 times the sheet area. The pedestal 236 in FIG. 21 may also have a thickness of 0.5 millimeters. An even better version might use tapered pins with finer diameter and greater density, as well as a laminated Al/Cu/Al sheet.

A further advantage in the use of the thin layer 152 of grease is noted. Grease tends to extrude most readily from a thick layer, and less readily from a thin layer. Therefore, the grease thinning process, using shearing and pressure as described above, tends to produce a moderately consistent final layer thickness in spite of various perturbations.

It is also noted that, while the embodiments disclosed in FIGS. 18-21 show a linear array of six chips 134, the inventive concepts apply to other arrays, particularly two-dimensional arrays of chips 134. For example, such array may include a total of nine chips arranged in a three by three square array. Or, by way of further example, a square array of 25 chips 134 may be arranged in rows or columns wherein each row has five chips and each column has five chips. The number of rows or columns is limited by viscous drag presented to air flowing through fins of the heat exchanger. By way of further example, a rectangular array of chips may be employed wherein the array is formed of three rows wherein each row has eight chips. The fins would extend in a direction across the three rows for conducting cooling air across the three rows. This orientation of the fins would provide substantially less fluid resistance to air flow than would an orientation of the fins in the long direction in which the cooling air would be forced to pass by eight columns of the fins. Therefore, in a two dimensional rectangular array, the fins of the heat exchanger are to be oriented for directing the flow of air along the shorter dimension of the array.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appeded claims.

What is claimed is:

1. A heat exchanger for transferring heat from an array of electric circuit chips to a fluid coolant comprising:
    a flexible sheet of thermally conductive material sufficiently large to cover the array of chips and sufficiently flexible to conform to individual orientations of the chips to make thermal contact therewith; and
    a set of thermally conductive fin assemblies extending normally from said sheet, said fin assemblies having fins directed for contacting a coolant for extraction of heat therefrom; and
    wherein said fin assemblies are thermally connected to said chips; and said sheet contacts said fin assemblies on fin surfaces of each said fin assembly opposite a connection of said sheet with said circuit chip, said sheet having undulations for flexible compliance with the surface of the fins for interaction with the coolant for extraction of heat from said fin assemblies.

2. A heat exchanger according to claim 1 wherein said sheet contacts said fin assemblies on a surface of each of said fin assemblies opposite fins of each of said fin assemblies, said sheet passing between each chip and its corresponding fin assembly and making thermal contact with each chip and fin assembly to allow heat generated within a chip to pass to the corresponding fin assembly.

3. A heat exchanger for transferring heat from an array of electric circuit chips to a fluid coolant comprising:
    a flexible sheet of electrically insulating material sufficiently large to cover the array of chips and sufficiently flexible to conform to individual orientations of the chips to make thermal contact therewith; and
    a set of thermally conductive fin assemblies extending normally from said sheet, said fin assemblies having fins directed for contacting a coolant for extraction of heat from the sheet; and wherein each of said fin assemblies comprises a base and a set of fins upstanding from said base, the base being disposed on one surface of said sheet, and the fins extending through an aperture in said sheet beyond a second surface of said sheet opposite said one surface.

* * * * *